United States Patent
Yano (10) Patent No.: US 10,049,747 B2
(45) Date of Patent: Aug. 14, 2018

(54) NAND FLASH MEMORY AND PROGRAM METHOD THEREOF FOR SUPPRESSING INFLUENCE OF FLOATING GATE COUPLING

(71) Applicant: Winbond Electronics Corp., Taichung (TW)

(72) Inventor: Masaru Yano, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/345,521

(22) Filed: Nov. 8, 2016

(65) Prior Publication Data

US 2017/0140826 A1    May 18, 2017

(30) Foreign Application Priority Data

Nov. 18, 2015 (JP) .................................. 2015-225308

(51) Int. Cl.
    *G11C 16/04*     (2006.01)
    *G11C 16/10*     (2006.01)
    *G11C 16/34*     (2006.01)

(52) U.S. Cl.
    CPC .......... *G11C 16/10* (2013.01); *G11C 16/3459* (2013.01); *G11C 16/0483* (2013.01)

(58) Field of Classification Search
    CPC .............................. G11C 16/10; G11C 16/3459
    USPC .................................................. 365/185.12
    See application file for complete search history.

(56) References Cited

U.S. PATENT DOCUMENTS

| | | | |
|---|---|---|---|
| 8,199,579 B2 * | 6/2012 | Shiino | G11C 11/5635 365/185.03 |
| 2008/0158950 A1 | 7/2008 | Aritome | |
| 2010/0299475 A1 | 11/2010 | Yano | |
| 2012/0195130 A1 * | 8/2012 | Park | G11C 16/0483 365/185.29 |
| 2014/0104950 A1 | 4/2014 | Yano | |

FOREIGN PATENT DOCUMENTS

| | | |
|---|---|---|
| JP | H11176177 | 7/1999 |
| JP | 2005025898 | 1/2005 |
| JP | 2009151865 | 7/2009 |
| JP | 2011181156 | 9/2011 |
| KR | 101184803 | 9/2012 |
| WO | 2006051917 | 5/2006 |

OTHER PUBLICATIONS

"Office Action of Taiwan Counterpart Application," dated May 26, 2017, p. 1-p. 6.
"Office Action of Korea Counterpart Application," with English translation thereof, dated Apr. 30, 2018, p. 1-p. 7.

* cited by examiner

*Primary Examiner* — Tha-O H Bui
(74) *Attorney, Agent, or Firm* — JCIPRNET (57) ABSTRACT

A NADN flash memory and a program method thereof suppressing an influence caused by FG coupling and having a high reliability are provided. The program method of the flash memory of the present invention includes a step of selecting pages of a memory array, a step of applying a programming voltage to even-numbered pages of the selected pages, a step of soft-programming odd-numbered pages of the selected pages and a step of applying the programming voltage to the odd-numbered pages after the programming of the even-numbered pages is completed.

9 Claims, 9 Drawing Sheets

NAND FLASH MEMORY AND PROGRAM METHOD THEREOF FOR SUPPRESSING INFLUENCE OF FLOATING GATE COUPLING

CROSS-REFERENCE TO RELATED APPLICATION

This application claims the priority benefit of Japan application serial no. 2015-225308, filed on Nov. 18, 2015. The entirety of the above-mentioned patent application is hereby incorporated by reference herein and made a part of this specification.

BACKGROUND OF THE INVENTION

Field of the Invention

The invention relates to a NAND flash memory, and particularly relates to a program method of selected pages.

Description of Related Art

In a NAND flash memory, when a page is read or programmed, in order to suppress a noise caused by capacitance coupling between bit lines, one word line separately operates for even-numbered pages and odd-numbered pages. For example, when the even-numbered page is read, the odd-numbered page is grounded, and when the odd-numbered page is read, the even-numbered page is grounded; and when the even-numbered page is programmed, programming of the odd-numbered page is disabled, and when the odd-numbered page is programmed, programming of the even-numbered page is disabled (for example, Japan paten publication No. 11-176177).

Along with propulsion of the low voltage and high integration of the flash memory, besides the capacitance coupling between the bit lines, the influence caused by floating gate (FG) coupling between memory cells also becomes non-ignorable. For example, when data "0" is programmed to the memory cells of the even-numbered page, if the adjacent memory cell is stored with data "1", a voltage difference between the two memory cells is increased, and a threshold of the adjacent memory cell is increased due to the FG coupling. If the programming is implemented under such environment, a threshold distribution range of the memory cells storing the data "1", "0" is enlarged, and the reliability of the flash memory is decreased.

SUMMARY OF THE INVENTION

The invention is intended to resolve the problem of the related art to provide a NAND flash memory with high reliability and suppressing the influence caused by the FG coupling between the adjacent memory cells.

The invention provides a program method to program pages of a NAND flash memory, which includes a step of selecting pages of a memory array, a step of programming even-numbered pages of the selected pages, a 1st soft-programming step to soft-program memory cells adjacent to the even-numbered pages, and a step of programming odd-numbered pages of the selected pages after programming of the even-numbered pages is completed.

The invention provides a NAND flash memory including a memory array formed with a plurality of memory cells; a page selecting part, which selects pages of the memory array; and a programming part, which programs pages selected by the page selecting part, and the programming part includes a part used for programming even-numbered pages of the selected pages, a part used for soft-programming the memory cells, and a part used for programming odd-numbered pages of the selected pages, where the part used for soft-programming the memory cells soft-programs the memory cells adjacent to the even-numbered pages.

According to the invention, by soft-programming the adjacent memory cells, the influence caused by the FG coupling is suppressed, such that the threshold distribution range of the memory cells is narrowed. In this way, the flash memory with high reliability is provided.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Embodiments of the invention are described below with reference of provided figures. Moreover, it should be noted that in the figures, the figures referred to herein are drawn for clarity of illustration and are not necessarily drawn to scale.

Figure 1:
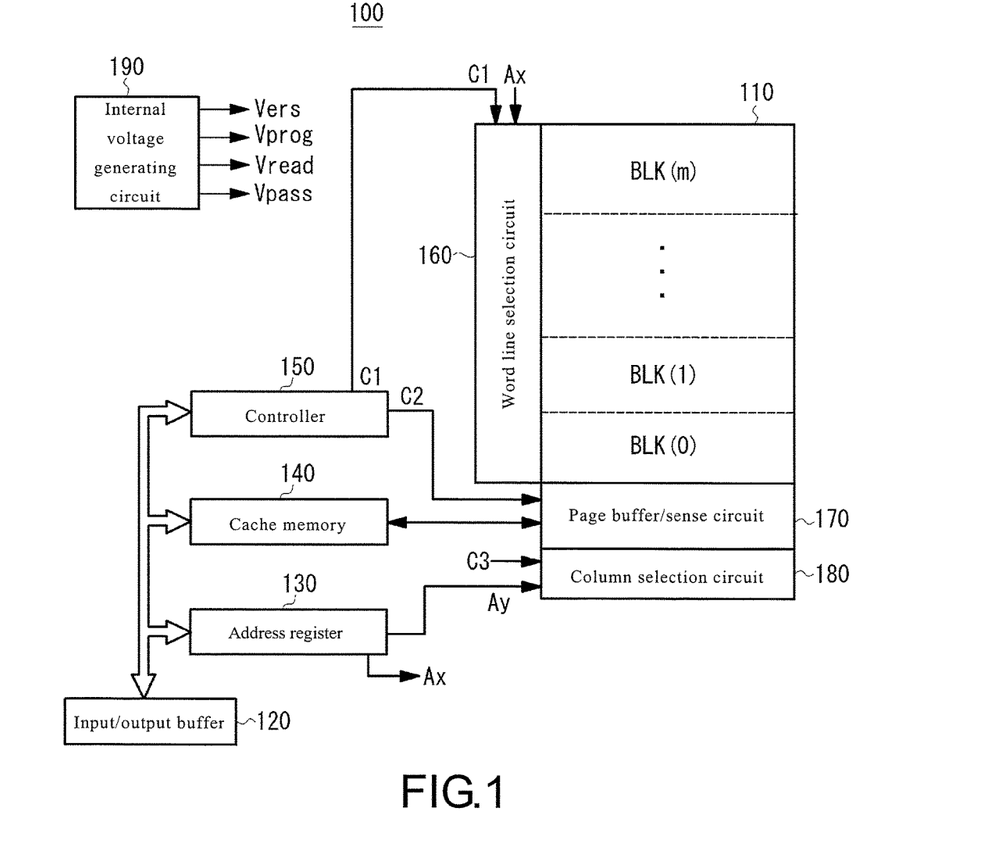
FIG. 1 is a block diagram of a flash memory according to an embodiment of the invention.

As shown in FIG. 1, the flash memory 100 includes a memory array 110, which is formed with a plurality of memory cells arranged in an array; an input/output buffer 120, which is connected to an external input/output terminal I/O; an address register 130, which receives address data coming from the input/output buffer 120; a cache memory 140, which keeps input/output data; a controller 150, which generates control signals C1, C2, C3, etc., where the control signals C1, C2, C3, etc., control each part based on command data coming from the input/output buffer 120 and external control signals (chip enable (CE), command latch enable (CLE), address latch enable (ALE), ready/busy (RY/BY), etc., that are not shown); a word line selection circuit 160, which decodes row address information Ax coming from the address register 130, and performs a block selection and a word line selection based on a decoding result; a page buffer/sense circuit 170, which keeps data read through the bit line, or keeps data programmed through the bit line; a column selection circuit 180, which decodes column address information Ay coming from the address register 130, and selects the bit line according to a decoding result; and an internal voltage generating circuit 190, which generates voltages required for reading, programming (writing) and erasing data (a programming voltage Vprog, a pass voltage Vpass, a read voltage Vread, an erase voltage Vers (including an erase pulse).

The memory array 110 has a plurality of blocks BLK (0), BLK(1), . . . , BLK(m) arranged along a column direction. The page buffer/sense circuit 170 is configured at one end portion of the blocks. However, the page buffer/sense circuit 170 can also be configured at the other end portion or both of the end portions of the blocks.

Figure 2:
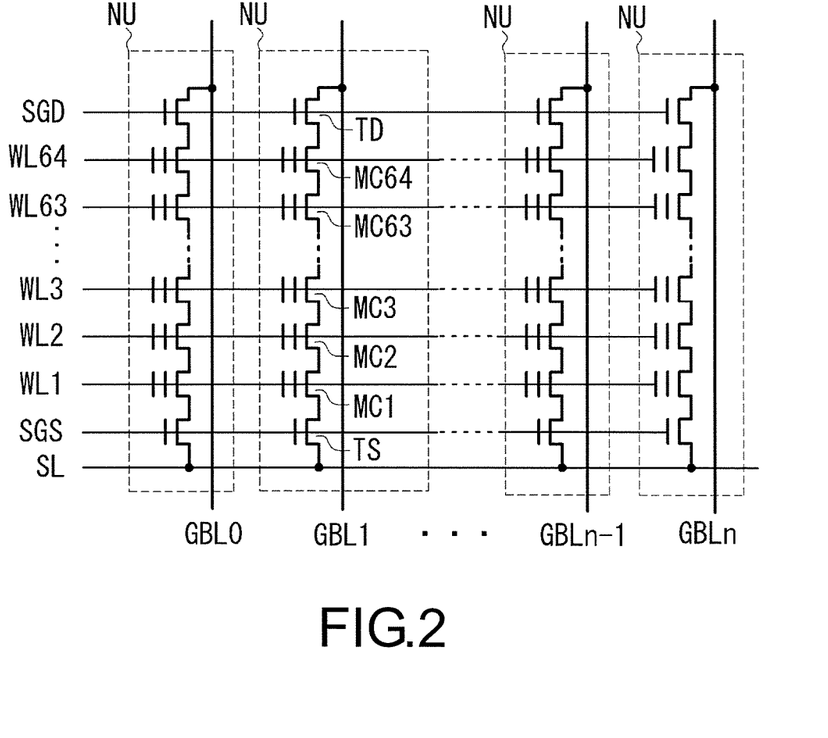
FIG. 2 is a circuit diagram of a structure of NAND strings of the flash memory.

As shown in FIG. 2, one block includes a plurality of NAND string units NU, and the NAND string units NU are constructed by serially connecting a plurality of memory cells. As shown in FIG. 2, in one block, n+1 string units NU are arranged along the row direction relative to the column direction. The string unit NU includes a plurality of memory cells MCi connected in series (i=1, 2, 3, . . . , 64); a bit line side selection transistor TD, which is connected to a drain of the memory cell MC64 serving as one of the end portions; and a source line side selection transistor TS, which is connected to a source of the memory cell MC1. A drain of the bit line side selection transistor TD is connected to a corresponding bit line GBL, and a source of the source line side selection transistor TS are connected to a common source line SL.

A control gate of the memory cell MCi is connected to a word line WLi, and gates of the selection transistors TD, TS are connected to selection gate lines SGD, SGS. The word line selection circuit 160 selects the block based on the row address Ax, and supplies a corresponding voltage to the selection gate lines SGS, SGD of the selected block.

Typically, the memory cell has a metal oxide semiconductor (MOS) structure, and the MOS structure includes a source/a drain serving as an N-type diffusion region, which is formed in a P-well; a tunnel oxide film, which is formed on a channel between the source/drain; a floating gate (a charge accumulation layer), which is formed on the tunnel oxide film; and a control gate, which is formed on the floating gate via separation of a dielectric film. When the floating gate is not accumulated with charges, i.e. the memory cell is written with data "1", a threshold is in a negative state, and the memory cell is non sally on. When the floating gate is accumulated with electrons, i.e. the memory is written with data "0", the threshold is shifted to positive, and the memory cell is normally off.

A following table 1 lists bias voltages applied in case of various operations of the flash memory. In a read operation, a certain positive voltage is applied to the bit line, a certain voltage (for example, 0V) is applied to the selected word line, a pass voltage Vpass (for example, 4.5V) is applied to the non-selected word lines, and a positive voltage (for example, 4.5V) is applied to the selection gate lines SGD, SGS, the bit line side selection transistor TD and the source line side selection transistor TS are turned on, and the common source line SL is set to 0V. In a program operation, a high-level programming voltage Vprog (15V-20V) is applied to the selected word line, a middle voltage (for example, 10V) is applied to the non-selected word lines, the bit line side selection transistor TD is turned on, and the source line side selection transistor TS is turned off, and a voltage corresponding to the data "0" or "1" is supplied to the bit line GBL. In an erase operation, 0V is applied to the selected word line in the block, a high voltage (for example, 20V) is applied to the P-well, and electrons of the floating gate are drained to a substrate, so as to erase data in unit of a block.

TABLE 1

|  | Erase | Program | Read |
|---|---|---|---|
| Selected WL | 0 | 15-20 V | 0 |
| Non-selected WL | F | 10 V | 4.5 |
| SGD | F | Vcc | 4.5 |
| SGS | F | 0 | 4.5 |
| SL | F | Vcc | 0 |
| P-well | 20 | 0 | 0 |

Figure 3:
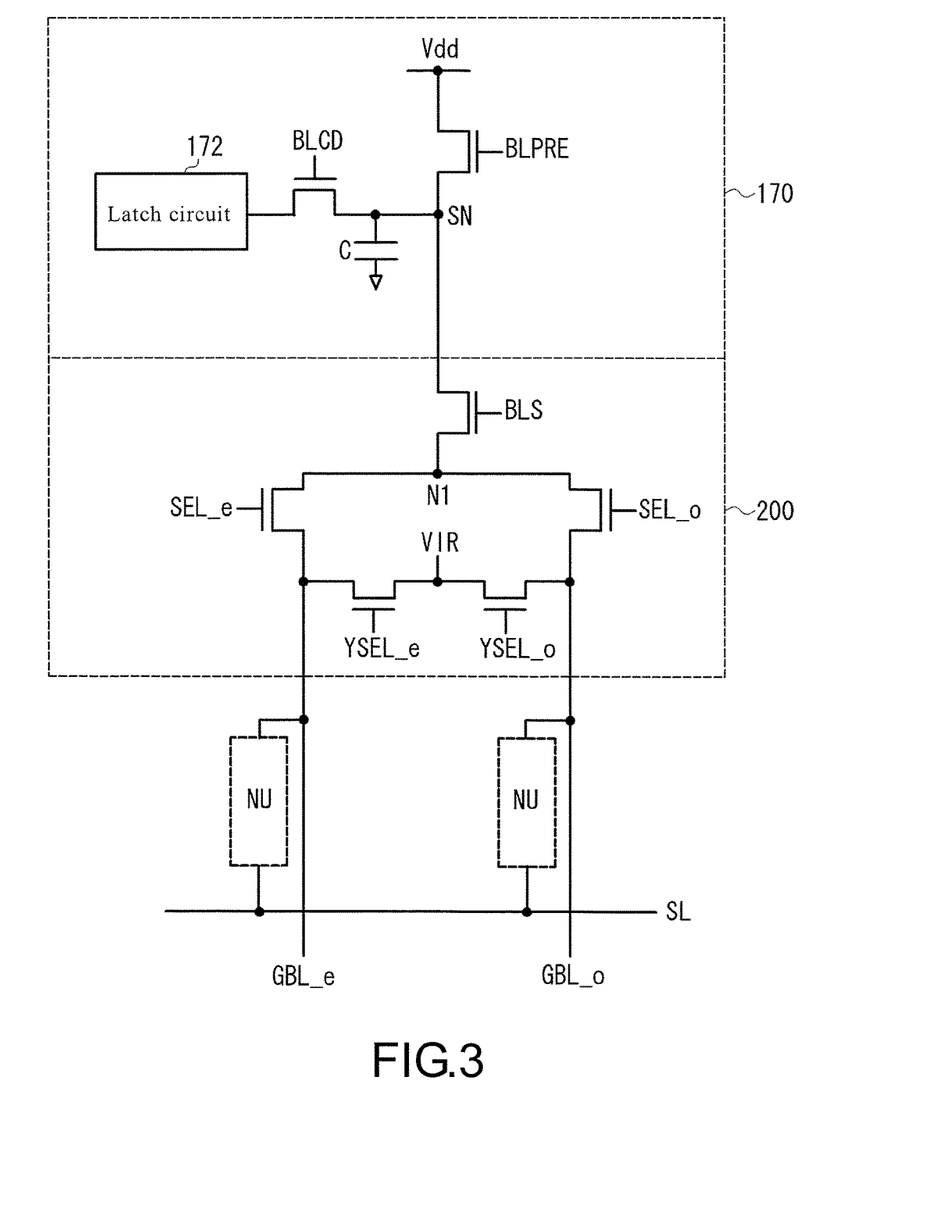
FIG. 3 is an example of a bit line selection circuit and a page buffer/sense circuit of the flash memory of the present embodiment.

FIG. 3 is an example of a bit line selection circuit and a page buffer/sense circuit. An even-numbered bit line GLB_e and an odd-numbered bit line GBL_o serving as a pair of bit lines is illustrated. The bit line selection circuit 200 includes an even-numbered selection transistor SEL_e, which is connected to the even-numbered bit line GBL_e; an odd-numbered selection transistor SEL_o, which is connected to the odd-numbered bit line GBL_o; an even-numbered bias selection transistor YSEL_e, which is connected between the even-numbered bit line GBL_e and a virtual potential VIR; an odd-numbered bias selection transistor YSEL_o, which is connected between the odd-numbered bit line GBL_e and a virtual potential VIR; and a bit line selection transistor BLS, which is connected to a common node N1 of the even selection transistor SEL_e and the odd selection transistor SEL_o.

The page buffer/sense circuit 170 is connected to the bit line selection circuit 200 through the bit line selection transistor BLS, and one page buffer/sense circuit 170 is shared by one pair of the even-numbered bit line GBL_e and the odd-numbered bit line GBL_o. The page buffer/sense circuit 170 includes a precharge transistor BLPRE, which provides a precharge potential to the bit line; a capacitor C, which is connected to a sense node SN formed between the precharge transistor BLPRE and the bit line selection transistor BLS; and a transmission transistor BLCD, etc., which is used for transmitting a potential of the sense node SN to a latch circuit 172.

When the selected pages are read or programmed, the selected pages are separated into even-numbered pages (the even-numbered bit line) and odd-numbered pages (the odd-numbered bit line) to implement the read and program operation. Namely, when the even-numbered pages are read, the even-numbered selection transistor SEL_e and the bit line selection transistor BLS are turned on, the odd-numbered selection transistor SEL_o is turned off, the even-numbered bias selection transistor YSEL_e is turned off, and the odd-numbered bias selection transistor YSEL_o is turned on, and the ground potential GND is supplied to the odd-numbered bit line GBL_o through the virtual potential VIR. When the odd-numbered pages are read, the odd-numbered selection transistor SEL_o and the bit line selection transistor BLS are turned on, the even-numbered selection transistor SEL_e is turned off, the even-numbered bias selection transistor YSEL_e is turned on, and the odd-numbered bias selection transistor YSEL_o is turned off, and the ground potential GND is supplied to the even-numbered bit line GBL_e through the virtual potential VIR. In this way, the read operation based on bit line shield is performed, and the noise caused by the capacitance coupling of the adjacent bit lines is decreased.

Moreover, when the even-numbered pages are programmed, the even-numbered selection transistor SEL_e and the bit line selection transistor BLS are turned on, the odd-numbered selection transistor SEL_o is turned off, the even-numbered bias selection transistor YSEL_e is turned off, and the odd-numbered bias selection transistor YSEL_o is turned on, and a program inhibiting voltage (for example, a certain positive voltage) is supplied to the odd-numbered bit line GBL_o through the virtual potential VIR. When the odd-numbered pages are programmed, the odd-numbered selection transistor SEL_o and the bit line selection transistor BLS are turned on, the even-numbered selection transistor SEL_e is turned off, the even-numbered bias selection transistor YSEL_e is turned on, and the odd-numbered bias selection transistor YSEL_o is turned off, and the program inhibiting voltage is supplied to the even-numbered bit line GBL_e through the virtual potential VIR.

Then, a detailed program operation of the flash memory is described below. The present embodiment has a following program mode, i.e. when the selected pages are programmed, the influence of the FG coupling between the adjacent memory cells is suppressed.

Figure 4:
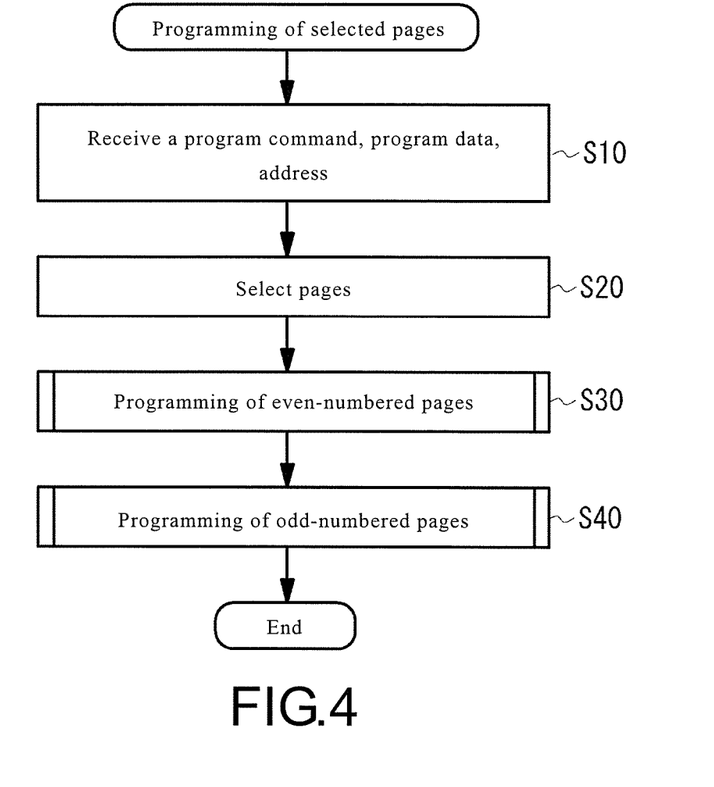
FIG. 4 is a flowchart illustrating a program operation of selected pages of the flash memory according to an embodiment of the invention.

As shown in FIG. 4. With reference of FIG. 1, first, after a program command, a program data, an address, etc., are received through the input/output buffer 120 (S10), the controller 150 starts a program sequence. The word line selection circuit 160 selects a block of the memory array 110 according to the row address information Ax, and selects a word line of the selected block. On the other hand, the column selection circuit 180 loads the program data to the page buffer/sense circuit 170 based on the column address information Ay.

Then, program of the word line selected by the word line selection circuit 160, i.e. program of the selected pages is started (S20). When the selected pages are programmed, the even-numbered pages are first programmed (S30), and after the programming of the even-numbered pages is completed, the odd-numbered pages are programmed (S40). In order to accurately or effectively implement electron injection to the memory cells, an incremental step pulse program (ISPP) method is adopted. In the ISPP method, an initial program pulse is applied, and when the initial program pulse is determined to be ineligible through program verification, a program pulse that is higher than the initial program pulse by only one step of voltage is applied, and the voltage of the program pulse is incrementally increased until programming of all of the memory cells in the page is determined to be eligible. Moreover, in the present embodiment, after the programming of the even-numbered pages is completed, the odd-numbered pages are programmed, though allocation of the even-numbered pages or the odd-numbered pages is arbitrary, and it is essentially the same to program the even-numbered pages after the programming of the odd-numbered pages is completed.

Figure 5:
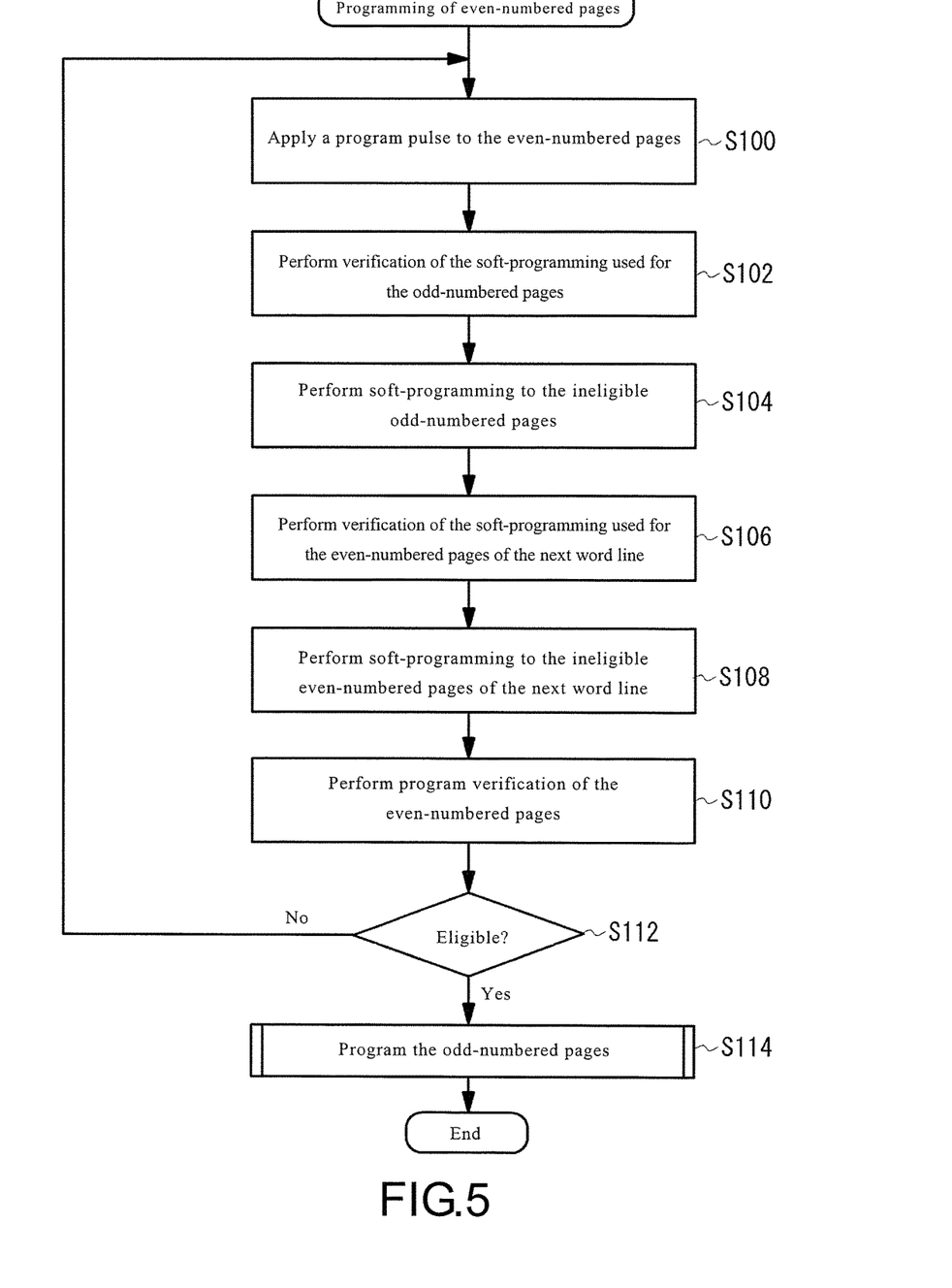
FIG. 5 is a flowchart illustrating a program operation of even-numbered pages of the selected pages of the present embodiment.
Figure 6:
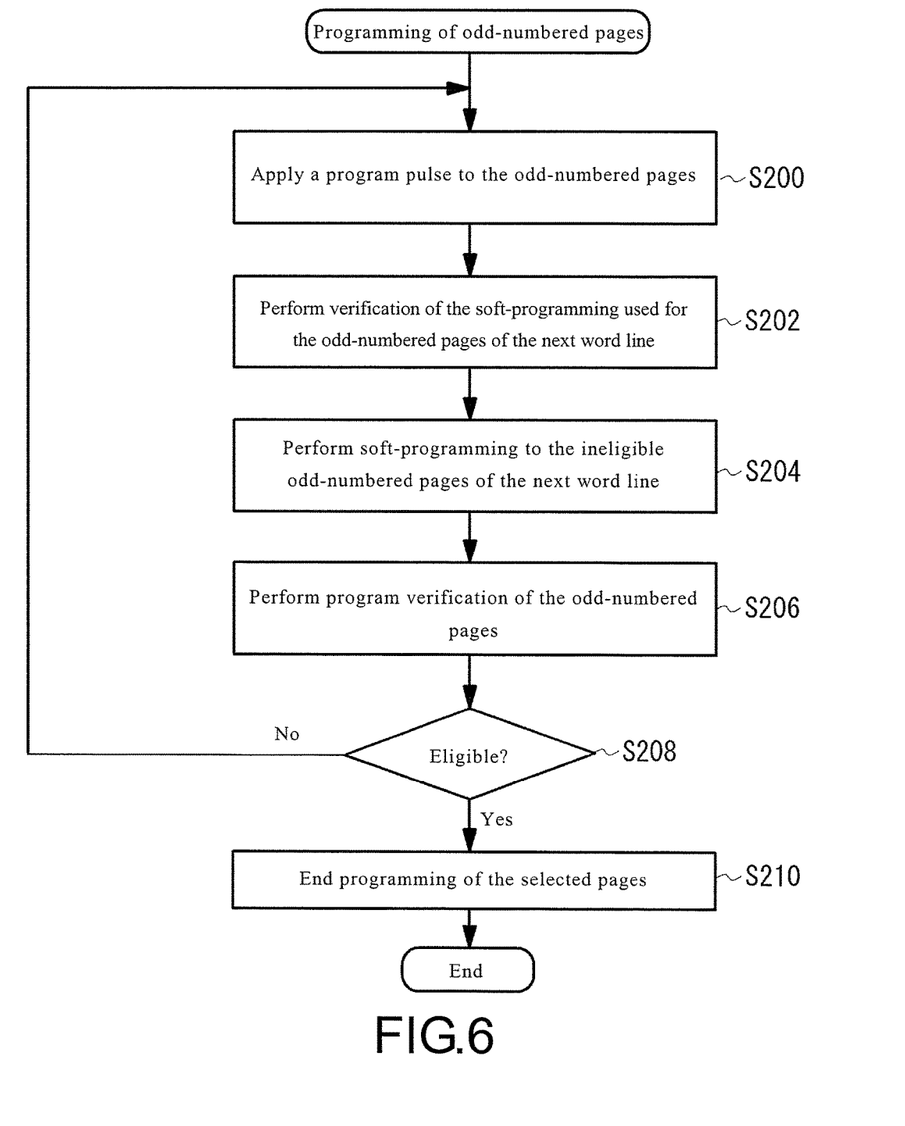
FIG. 6 is a flowchart illustrating a program operation of odd-numbered pages of the selected pages of the present embodiment.

FIG. 5 is a flowchart illustrating a program operation of the even-numbered pages, FIG. 6 is a flowchart illustrating a program operation of the odd-numbered pages. FIG. 7A-FIG. 7F are schematic diagrams illustrating shift of thresholds of the memory cells caused by FG coupling when the even-numbered pages/odd-numbered pages are programmed, in which e1, e2, e3, e4 represent the even-numbered bit lines, o1, o2, o3 represent the odd-numbered bit lines, WL1, WL2, WL3 represent word lines, and hatching represents the shift of the threshold of the memory cell. Moreover, following tables 2A-2C list value examples of the threshold when the even-numbered pages are programmed in the program operation of the present embodiment, and tables 2D-2F list value examples of the threshold when the odd-numbered pages are programmed in the program operation of the present embodiment. In the tables 2A-2F, in order to facilitate understanding the threshold variation caused by the FG coupling, values of "0" to "10" are used to represent a lower limit of the threshold distribution of erasing of the data "1" to an upper limit of the threshold distribution of the programming of the data "0".

TABLE 2A

|              | e1 | o1  | e2 | o2  | e3  | o3  | e4  |
|--------------|----|-----|----|-----|-----|-----|-----|
| Program data |  0 |  1  |  1 |  1  |  0  |  1  |  0  |
| WL3          |    |     |    |     |     |     |     |
| WL2          | 1.2|  0  |  0 |  0  | 1.2 | 0.2 | 1.2 |
| WL1          |  3 | 1.5 |  0 | 1.5 |  3  |  2  |  3  |

TABLE 2B

|              | e1 | o1 | e2 | o2 | e3 | o3  | e4 |
|--------------|----|----|----|----|----|-----|----|
| Program data |  0 |  1 |  1 |  1 |  0 |  1  |  0 |
| WL3          |    |    |    |    |    |     |    |
| WL2          |  2 |  0 |  2 |  0 |  2 | 0.2 |  2 |
| WL1          |  3 |  2 |  0 |  2 |  3 |  2  |  3 |

TABLE 2C

|              | e1  | o1 | e2  | o2 | e3  | o3  | e4  |
|--------------|-----|----|-----|----|-----|-----|-----|
| Program data |  0  |  1 |  1  |  1 |  0  |  1  |  0  |
| WL3          |     |    |     |    |     |     |     |
| WL2          | 2.7 |  0 | 2.2 |  0 | 2.8 | 0.3 | 2.6 |
| WL1          |  8  |  3 | 0.7 |  3 | 8.2 | 3.2 |  8  |

TABLE 2D

|              | e1  | o1  | e2  | o2 | e3  | o3  | e4  |
|--------------|-----|-----|-----|----|-----|-----|-----|
| Program data |  1  |  0  |  1  |  1 |  1  |  0  |  1  |
| WL3          |     |     |     |    |     |     |     |
| WL2          | 2.7 | 0.7 | 2.6 |  0 | 2.8 | 1.0 | 2.6 |
| WL1          | 8.1 | 4.5 | 1.5 |  3 | 8.3 | 4.7 | 8.1 |

TABLE 2E

|              | e1  | o1  | e2  | o2 | e3  | o3  | e4  |
|--------------|-----|-----|-----|----|-----|-----|-----|
| Program data |  1  |  0  |  1  |  1 |  1  |  0  |  1  |
| WL3          |     |     |     |    |     |     |     |
| WL2          | 2.7 |  2  | 2.6 |  2 | 2.8 |  2  | 2.6 |
| WL1          | 8.1 | 4.5 | 1.5 |  3 | 8.3 | 4.7 | 8.1 |

TABLE 2F

|  | e1 | o1 | e2 | o2 | e3 | o3 | e4 |
|---|---|---|---|---|---|---|---|
| Program data WL3 | 1 | 0 | 1 | 1 | 1 | 0 | 1 |
| WL2 | 2.7 | 2.6 | 2.6 | 2 | 2.8 | 2.6 | 2.6 |
| WL1 | 8.5 | 8 | 2.4 | 3.3 | 8.5 | 8 | 8.5 |

Figure 7A:
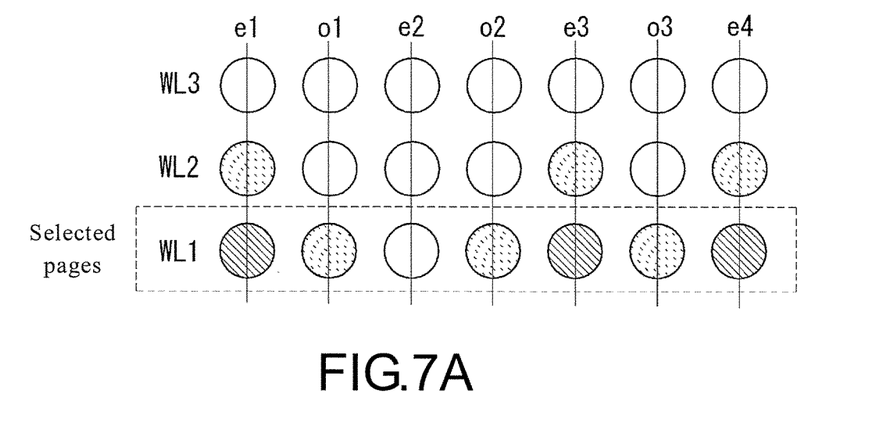
FIG. 7A-FIG. 7C are schematic diagrams illustrating a threshold variation of the memory cells when the even-numbered pages are programmed in the program operation of the present embodiment.
Figure 7B:
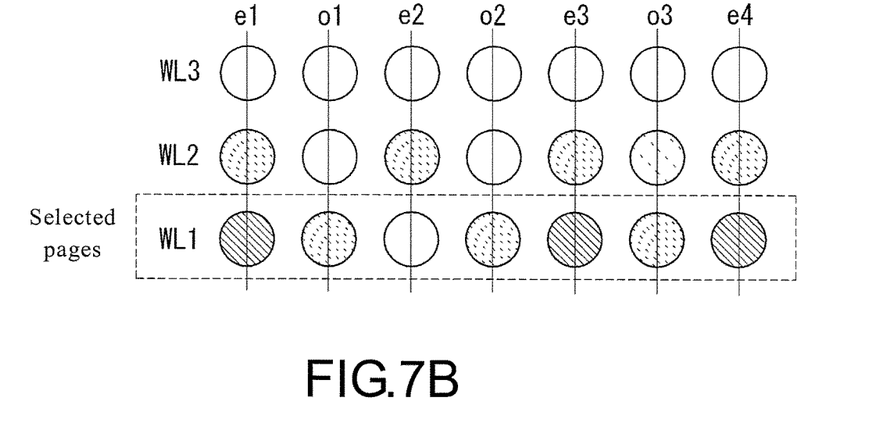
Figure 7C:
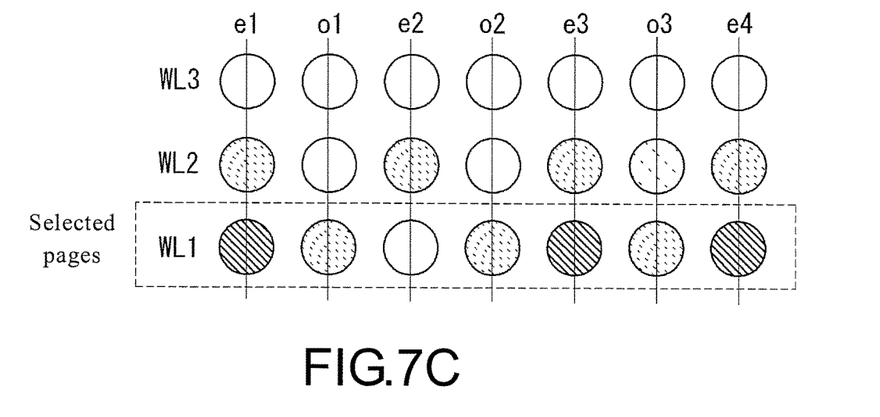

First, as shown in FIG. 5, in order to program the even-numbered pages of the selected pages, a 1$^{st}$ program pulse is applied to the even-numbered pages (S100), and a state thereof is shown in FIG. 7A. The word line WL1 is the selected pages. Moreover, before the programming is performed, all of the memory cells are in an erasing state. Now, the page buffer/sense circuit 170 is configured with the program data "0111010" as shown in the table 2A. Namely, the data "1", i.e. the program inhibiting voltage is supplied to the odd-numbered bit lines o1, o2, o3, and voltages corresponding to the data "0100" are supplied to the even-numbered bit lines e1, e2, e3 and e4.

A 1$^{st}$ program pulse generated by the internal voltage generating circuit 190 is applied to the word line WL1 to inject electrons to the memory cells of the even-numbered bit lines e1, e3, e4 of the data "0", and the thresholds of the memory cells are shifted towards a positive direction, and it is assumed that the threshold is shifted to "3". Since the thresholds of the memory cells programmed with the data "0" are shifted to the positive direction, the threshold of the adjacent memory cell is shifted to the positive direction due to the FG coupling. To be specific, as shown in the table 2A, the threshold of the memory cell of the odd-numbered bit line o1 is shifted to "1.5" due to the FG coupling effect with the memory cell of the even-numbered bit line e1, and the threshold of the memory cell of the odd-numbered bit line o2 is shifted to "1.5" due to the FG coupling effect with the memory cell of the even-numbered bit line e3. The threshold of the memory cell of the odd-numbered bit line o3 is shifted to "2" due to the FG coupling effect with the two memory cells of the even-numbered bit lines e3 and e4. In the next word line WL2 adjacent to the selected pages WL1, the thresholds of the memory cells of the even-numbered bit lines e1, e3, e4 are shifted to "1.2" due to the influence of the FG coupling. Moreover, the threshold of the memory cell of the odd-numbered bit line o3 is shifted to "0.2". By applying the 1$^{st}$ program pulse, as shown in FIG. 7A, the thresholds of the odd-numbered pages adjacent to the even-numbered pages with the memory cells programmed with the data "0" and the even-numbered pages of the next word line WL2 are slightly increased.

Referring back to FIG. 4, when applying of the 1$^{st}$ program pulse to the even-numbered pages is completed, the controller 150 performs verification to the soft-programming used for the adjacent memory cells in the selected pages, i.e. the odd-numbered pages (S102). As described above, the threshold of the memory cell adjacent to the memory cell programmed with the data "0" of the even-numbered page is increased due to the FG coupling, though in the present embodiment, the soft-programming of the adjacent memory cell performed under the premise that the threshold of the memory cell is increased due to the FG coupling makes the threshold of the adjacent memory cell to be converged to a fixed value. The verification is to apply a verifying voltage to the selected word line WL1, and the others steps similar to the general read operation. As shown in the table 2A, the threshold used for determining whether the verification of the soft-programming is eligible is, for example, set to "2". As a result, the thresholds of the odd-numbered bit lines o1, o2 are "1.5", which is ineligible, and the threshold of the odd-numbered bit line o3 is "2", which is eligible.

The controller 150 performs soft-programming to the odd-numbered pages regarded as ineligible based on the determination result of the verification (S104). In the example of FIG. 2A, the soft-programming is performed to the memory cells of the odd-numbered bit lines o1, o2. In the soft-programming, a soft-programming voltage Vsoft set to be lower than the voltage of the general program pulse is applied to the selected word line WL1, a voltage suitable for programming is supplied to the odd-numbered bit lines o1, o2 regarded to be ineligible, and a program inhibiting voltage is supplied to the odd-numbered bit line o3 regarded to be eligible. Moreover, the program inhibiting voltage is also supplied to the even-numbered bit lines. The thresholds of the memory cells of the odd-numbered bit lines o1, o2 regarded to be ineligible are shifted towards the positive direction through the soft-programming. The soft-programming and the verification thereof are repeatedly performed until the thresholds of the memory cells of all of the odd-numbered bit lines are eligible (in the present embodiment, until the threshold is "2"). As a result, as shown in the table 2B, the thresholds of the odd-numbered bit lines o1, o2, o3 are converged to "2".

Then, the controller 150 performs verification of the soft-programming used for the even-numbered pages of the next word line adjacent to the selected pages (S106). Through the programming of the data "0" of the even-numbered pages of the word line WL1, the thresholds of the memory cells of the even-numbered pages of the adjacent word line WL2 are increased due to the FG coupling. In the present embodiment, under the premise that the thresholds of the memory cells of the even-numbered pages of the adjacent word line are increased due to the FG coupling, the soft-programming is performed to the memory cells to converge the thresholds thereof to a fixed value. The threshold of the verification is the same with that of the soft-programming of the odd-numbered pages, and it is determined whether the threshold has reached "2". In the example of the table 2A, the thresholds of the memory cells of the even-numbered bit lines e1, e2, e3, e4 of the word line WL2 are smaller than "2", so that the memory cells are determined to be eligible.

Then, the controller 150 performs the soft-programming to the memory cells of the even-numbered pages of the next word line that are regarded to be eligible (S108). Soft-programming is performed in the way the same with that of the step S104. As a result, as shown in the table 2B, the thresholds of the memory cells of the even-numbered pages of the adjacent word line WL2 are converged to "2". In this way, the thresholds of the adjacent memory cells of the word lines WL1, WL2 are set to "2" through the soft-programming.

Then, the controller 150 performs program verification of the even-numbered pages (S110). Namely, when the memory cell of the data "0" to be injected with charges is determined to be eligible (S112), a next program pulse is applied to the memory cell, and the steps S100-S110 are repeated until the programming of all of the memory cells are determined to be eligible. For example, if the threshold determined through the program verification is set to "8", as shown in the table 2C, the thresholds of the memory cells of the even-numbered bit lines e1, e3, e4 of the selected pages are "8" or more than "8". Since the thresholds of the memory cells of the even-numbered bit lines e1, e3, e4 are more than "8", the thresholds of the memory cells adjacent thereto are further increased due to the FG coupling. It should be noted that when the programming voltage is applied to the memory cells programmed with the data "0", the thresholds of the adjacent memory cells are increased to a fixed value due to the soft-programming, so that compared to the situation that the soft-programming is not performed to the adjacent memory cells, a voltage difference between the adjacent memory cells and the memory cells programmed with the data "0" in the even-numbered pages is decreased, and a shift amount of the threshold is decreased due to the FG coupling. Therefore, when the programming of the even-numbered pages is completed, the programming of the odd-numbered pages is started (S114).

Figure 7D:
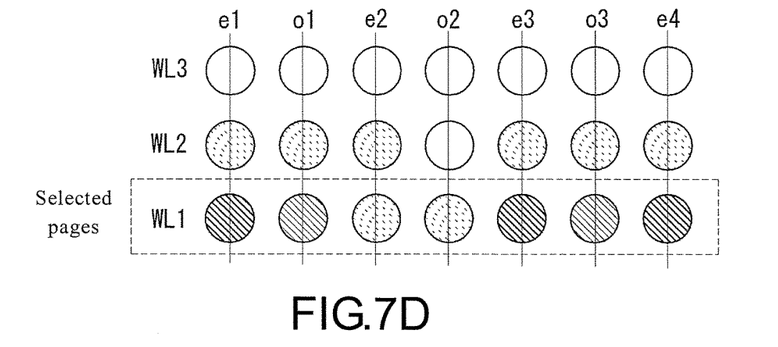
FIG. 7D-FIG. 7F are schematic diagrams illustrating a threshold variation of the memory cells when the odd-numbered pages are programmed in the program operation of the present embodiment.
Figure 7E:
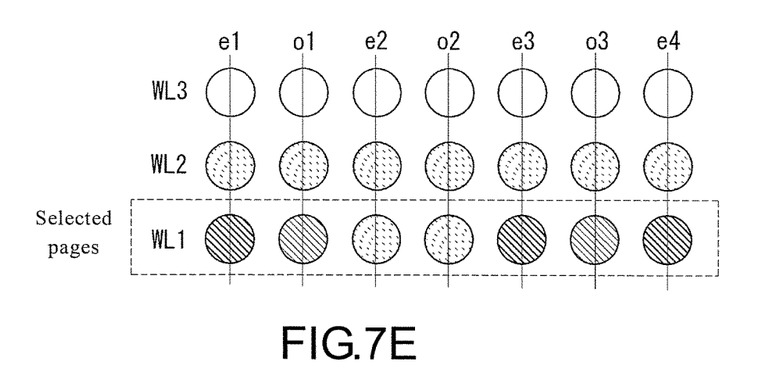

Then, the programming of the odd-numbered pages is described with reference of FIG. 6. In order to program the odd-numbered pages, the controller 150 applies the $1^{st}$ program pulse to the word line WL1 (S200). Now, the program inhibiting voltage is supplied to the even-numbered bit lines in form of data "1", and a voltage corresponding to the program data is supplied to the odd-numbered bit lines. In the examples of the tables 2D-2F, program data "010" is set to the odd-numbered bit lines o1, o2, o3, and the thresholds of the odd-numbered bit lines o1, o3 are shifted to "4.5", "4.7". Accordingly, the thresholds of the adjacent memory cells are also increased due to the FG coupling. FIG. 7D illustrates a situation of the $1^{st}$ program of the odd-numbered pages.

Then, the controller 150 performs the verification of the soft-programming used for the odd-numbered pages of the next word line (S202). The threshold of the verification is the same with that of the soft-programming of the even-numbered pages, and it is determined whether the threshold has reached "2". In the examples of the tables 2D-2F, the thresholds of the odd-numbered bit lines o1, o2, o3 of the word line WL2 are all smaller than "2", so that the memory cells are determined to be ineligible.

Then, the soft-programming is performed to the odd-numbered pages of the word line WL2 that are regarded to be ineligible (S204). As a result, as shown in the table 2E, the thresholds of the memory cells of the odd-numbered bit lines o1, o2, o3 of the word line WL2 are converged to "2".

Then, the controller 150 performs the program verification of the odd-numbered pages, and if the ineligible memory cell exists, the controller 150 applies a next program pulse to the memory cell (S200). The steps S200-S206 are repeated until all of the memory cells of the odd-numbered pages are eligible. Moreover, when the programming of the odd-numbered pages is completed, the programming of the selected pages is completed (S210).

Figure 7F:
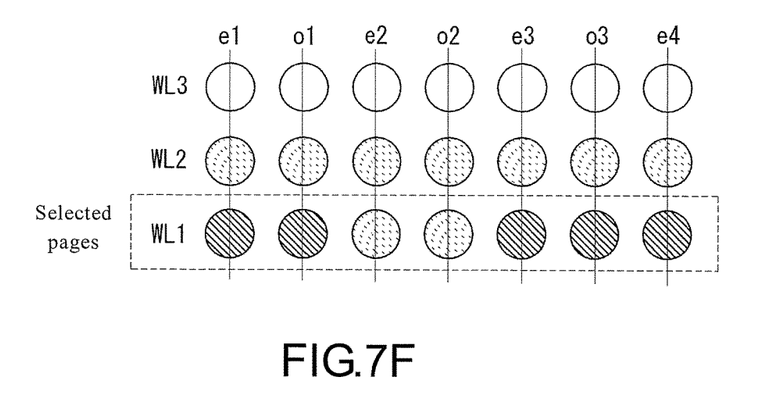

FIG. 7F and the table 2F show the thresholds of each of the memory cells when the programming of the odd-numbered pages is completed. It should be noted that in the programming of the odd-numbered pages, the soft-programming is performed to the odd-numbered pages of the adjacent word line, so that the voltage difference between the memory cell programmed with the data "1" and the memory cell programmed with the data "0" is reduced, and shift of the threshold caused by the FG coupling is mitigated. Moreover, the thresholds of all of the memory cells of the adjacent word line WL2 are shifted towards the positive direction through the soft-programming, though these thresholds can be converted within a fixed range. This is because that the voltage difference with the memory cell programmed with the data "0" is decreased, and the influence caused by the FG coupling is decreased.

When the programming of the next word line WL2 is performed, the programming of the even-numbered pages can be the same with the programming of the odd-numbered pages, and only the soft-programming of the even-numbered pages of the adjacent next word line WL3 is performed, i.e. the step S102 and the step S104 of the flow shown in FIG. 5 are skipped. The reason thereof is that as shown in FIG. 7F or the table 2F, when the programming of the word line WL2 is performed, the thresholds of all of the memory cells of the even-numbered pages and the odd-numbered pages of the word line WL2 are in a soft-programmed state. Regarding the word line WL2, the voltage difference between the memory cell programmed with the data "0" and the memory cell programmed with the data "1" is reduced compared with that when the soft-programming is not performed, so that the shift of the threshold caused by the FG coupling is suppressed.

Figure 8:
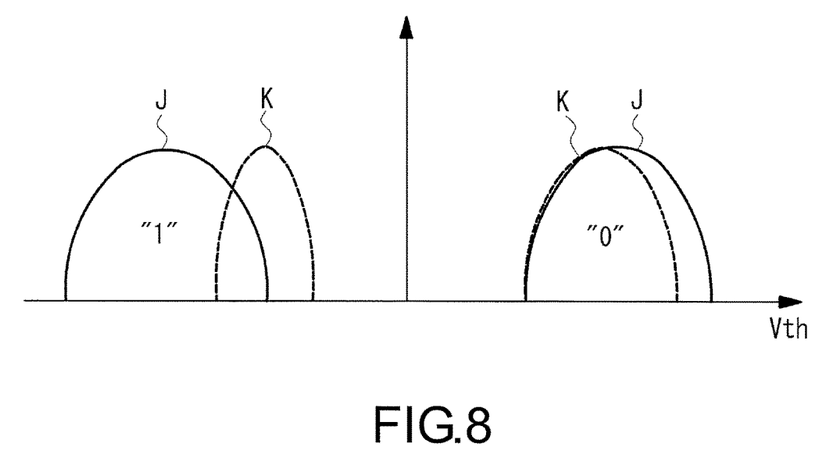
FIG. 8 is a diagram illustrating a program effect of the present embodiment.

FIG. 8 illustrates a threshold distribution of the data "1" and a threshold distribution of the data "0". A waveform J represents a threshold distribution of the conventional program method that the soft-programming is not performed to the adjacent memory cells, and a dot line K represents a threshold distribution of the program method of the present embodiment that the soft-programming is performed to the adjacent memory cells. In the present embodiment, as described above, during the programming process of the even-numbered pages, the soft-programming is performed to the adjacent memory cells. Therefore, the threshold of the data "1" is increased, and when the data "0" is programmed, the voltage difference between the memory cell programmed with the data "0" and the memory cell programmed with the data "1" is decreased, and the shift of the threshold caused by the FG coupling is suppressed. As a result, the distribution range of the thresholds of the data "1" and the data "0" is narrowed compared with a conventional distribution range.

In the present embodiment, the memory cell storing data of 1 bit is taken as an example for description, though the memory cell may also store data of a plurality of bits. Moreover, in the present embodiment, the NAND strings formed on a surface of a substrate is taken as an example for description, though the NAND strings can also be formed on the surface of the substrate in a three-dimensional way.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A program method of a NAND flash memory, configured to program pages of the NAND flash memory, the program method comprising:
   selecting pages of a memory array;
   programming even-numbered pages of the selected pages; and
   programming odd-numbered pages of the selected pages after the programming of the even-numbered pages is completed,
   wherein programming the even-numbered pages of the selected pages comprises:
   applying a programming voltage to the even-numbered pages of the selected pages;
   performing a $1^{st}$ verification used for a soft-programming of the odd-numbered pages of the selected pages after applying the programming voltage to the even-numbered pages of the selected pages; and performing the soft-programming to the odd-numbered pages of the selected pages based on a determination result of the $1^{st}$ verification.

2. The program method of the NAND flash memory as claimed in claim 1, wherein programming the even-numbered pages of the selected pages further comprises:

performing a $2^{nd}$ verification used for the soft-programming of even-numbered pages of a next word line adjacent to the selected pages; and performing the soft-programming to the even-numbered pages of the next word line adjacent to the selected pages based on a determination result of the $2^{nd}$ verification.

3. The program method of the NAND flash memory as claimed in claim 1, wherein programming the odd-numbered pages of the selected pages comprises:

applying a programming voltage to the odd-numbered pages; and performing the soft-programming to odd-numbered pages of a next word line adjacent to the odd-numbered pages.

4. The program method of the NAND flash memory as claimed in claim 3, wherein performing the soft-programming to the odd-numbered pages of the next word line adjacent to the odd-numbered pages comprises verification of the soft-programming.

5. The program method of the NAND flash memory as claimed in claim 1, wherein programming the even-numbered pages of the selected pages comprises verification of the programming, programming the odd-numbered pages of the selected pages comprises verification of the programming.

6. A NAND flash memory, comprising:

a memory array, formed with a plurality of memory cells;

a controller, generates a control signal to control operations in the memory array;

a word line selection circuit comprises:

a selector, selecting pages of the memory array; and a programmer, programming selected pages selected by the selector, and used for programming even-numbered pages of the selected pages, soft-programming the memory cells, and programming odd-numbered pages of the selected pages, wherein the programmer applies a programming voltage to the even-numbered pages of the selected pages, the programmer performs a $1^{st}$ verification used for a soft-programming of the odd-numbered pages of the selected pages after applying the programming voltage to the even-numbered pages of the selected pages, and performs the soft-programming to the odd-numbered pages of the selected pages based on a determination result of the $1^{st}$ verification.

7. The NAND flash memory as claimed in claim 6, wherein the programmer performs a $2^{nd}$ verification used for the soft-programming of even-numbered pages of a next word line adjacent to the selected pages, and performs the soft-programming to the even-numbered pages of the next word line adjacent to the selected pages based on a determination result of the $2^{nd}$ verification.

8. The NAND flash memory as claimed in claim 6, wherein during a process of programming the odd-numbered pages, the programmer further soft-programs odd-numbered pages of a next word line adjacent to the odd-numbered pages.

9. The NAND flash memory as claimed in claim 6, wherein the programmer comprises verification of the programming for programming the even-numbered pages of the selected pages and programming the odd-numbered pages of the selected pages.

* * * * *